(12) United States Patent
Schulze et al.

(10) Patent No.: US 8,633,095 B2
(45) Date of Patent: Jan. 21, 2014

(54) SEMICONDUCTOR DEVICE WITH VOLTAGE COMPENSATION STRUCTURE

(75) Inventors: Hans-Joachim Schulze, Taufkirchen (DE); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 183 days.

(21) Appl. No.: 13/174,319

(22) Filed: Jun. 30, 2011

(65) Prior Publication Data
US 2013/0001674 A1    Jan. 3, 2013

(51) Int. Cl.
*H01L 21/00* (2006.01)
(52) U.S. Cl.
USPC ............................ 438/492; 438/212; 438/268
(58) Field of Classification Search
USPC ......................................... 438/492, 212, 268
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 5,438,215 A | 8/1995 | Tihanyi | |
| 6,294,418 B1* | 9/2001 | Noble | 438/212 |
| 6,639,272 B2* | 10/2003 | Ahlers et al. | 257/328 |
| 6,689,660 B1* | 2/2004 | Noble et al. | 438/268 |
| 6,777,744 B2* | 8/2004 | Noble | 257/330 |
| 6,838,729 B2* | 1/2005 | Schlogl et al. | 257/328 |
| 7,126,186 B2* | 10/2006 | Weber et al. | 257/327 |
| 7,193,293 B2* | 3/2007 | Weber et al. | 257/547 |
| 7,582,531 B2* | 9/2009 | Siemieniec et al. | 438/268 |
| 7,589,378 B2* | 9/2009 | Kocon et al. | 257/343 |
| 8,309,987 B2* | 11/2012 | Derluyn et al. | 257/192 |
| 2002/0135014 A1* | 9/2002 | Ahlers et al. | 257/328 |
| 2002/0167082 A1* | 11/2002 | Weber et al. | 257/696 |

(Continued)

FOREIGN PATENT DOCUMENTS

DE    19808348 C1    6/1999

OTHER PUBLICATIONS

Fan, X., et al., "SiGe/Si superlattice microcoolers," Applied Physics Letters, Mar. 12, 2001, pp. 1580-1582, vol. 78, Issue 11, American Institute of Physics.

(Continued)

*Primary Examiner* — Laura Menz
(74) *Attorney, Agent, or Firm* — Murphy, Bilak & Homiller, PLLC

(57) ABSTRACT

A semiconductor device with a high voltage compensation component is manufactured by etching a trench into an epitaxial semiconductor material doped with n-type dopant atoms and p-type dopant atoms and disposing a first semiconductor or insulating material along one or more sidewalls of the trench. The first semiconductor or insulating material has a dopant diffusion constant which is at least 2× different for the n-type dopant atoms than the p-type dopant atoms. A second semiconductor material is disposed in the trench along the first semiconductor or insulating material. The second semiconductor material has a different dopant diffusion constant than the first semiconductor or insulating material. More n-type dopant atoms or p-type dopant atoms are diffused from the epitaxial semiconductor material through the first semiconductor or insulating material into the second semiconductor material than the other type of dopant atoms so that a lateral charge separation occurs between the second semiconductor material and the epitaxial semiconductor material.

16 Claims, 14 Drawing Sheets

(56) References Cited

U.S. PATENT DOCUMENTS

| | | |
|---|---|---|
| 2003/0151087 A1* | 8/2003 | Weber et al. .................. 257/327 |
| 2003/0155610 A1* | 8/2003 | Schlogl et al. ................. 257/335 |
| 2006/0211189 A1* | 9/2006 | Siemieniec et al. .......... 438/212 |
| 2006/0244060 A1 | 11/2006 | Kapels et al. |
| 2008/0246086 A1* | 10/2008 | Korec et al. ................... 257/343 |
| 2009/0039869 A1* | 2/2009 | Williams .................. 324/123 R |
| 2010/0012977 A1* | 1/2010 | Derluyn et al. ............... 257/194 |
| 2013/0001674 A1* | 1/2013 | Schulze et al. ................ 257/329 |

OTHER PUBLICATIONS

Wang, Y., et al., "Simulation study of semi-superjunction power MOSFET with SiGe pillar," Superlattices and Microstructures, Feb. 2, 2010, pp. 314-324, vol. 47, Issue 2, Elsevier Ltd.

Weber, H., "Herstellungsverfahren für ein Kompensationsbauelement/Verfahren zur definierten Ladungstrennung bei doppelt dotierter Ausgangsepischicht," Siemens Disclosure Journal, Jun. 1, 2002, pp. 1-6, Machine translation of title and abstract attached hereto.

* cited by examiner

SEMICONDUCTOR DEVICE WITH VOLTAGE COMPENSATION STRUCTURE

FIELD OF TECHNOLOGY

The present application relates to semiconductor devices, in particular semiconductor devices with voltage compensation structures.

BACKGROUND

Compensation MOSFETs (metal-oxide-semiconductor field-effect transistors) have p-type regions and n-type regions arranged next to each other under the actual device in the active volume in such a way that these regions can mutually 'electrically compensate' for each other during blocking, so that a non-interrupted, low-resistance conductive path is formed in the switched-on state from the source to the drain. Each of the charging regions, also referred to as columns, contain only a fraction of the breakthrough surface charge when seen in the horizontal direction (where the horizontal surface charge<qc'). Due to the special type of structure in this case, with a given breakdown voltage, the doping of the n-path can be massively increased for the structural components used for voltage compensation compared with conventional structural components. A desirable reduction of switching resistance is achieved in this manner and a distinctly increased added value is therefore also achieved.

However, one part of this added value is negated by the increased expense incurred to create the complicated p-type and n-type column regions of the voltage absorbing volume. Conventional manufacturing methods used to create such voltage compensation structures are quite complicated and have very high costs, and therefore greatly reduce the added value that is achieved with the compensation structures. In addition, the lower limit of possible dimensions of the voltage compensation structures available with existing techniques has been reached, so that further shrinking in size will be difficult to achieve in the next technological generations. A technological transformation has not been realized so far because the required manufacturing tolerances could not be achieved with conventional processes.

Voltage compensation components are mainly produced with a so-called 'multiple epitaxy' process. In this case, an n-doped epitaxial layer, which is several μm thick, is first grown on a highly n-doped substrate and commonly referred to as 'buffer epi'. In addition to a doping level introduced in the epitaxial step doping ions are introduced into the buffer epi through a photoresist mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type and n-type voltage compensation regions. The manufacturing of the actual devices can then be conducted at this point. Due to the fact that several expensive epitaxial steps are used including intermediate operations such as photo technology, implantation, etc., the 'multiple epitaxy' process explained above is very expensive and time consuming.

Another conventional technique for fabricating voltage compensation components involves trench etching and compensation with trench filling. Initial development of this process included discussions during which both column types (mostly the p-type columns) were defined with trench etching, followed by epitaxial filling to prevent disadvantageous costs which arise when using several different epitaxial layers as explained above with regard to the 'multiple epitaxy' process. At the same time, the volume which absorbs the voltage in a single epitaxial step (n-doped epi) is isolated on a highly n-doped substrate, so that the thickness corresponds to the total thickness of the multilayered epitaxial structure. After that, a deeper trench is etched, which determines the form of the p-column. This trench is then filled with p-doped epi which is free of crystal defects. The isolation of the thick n-layer is not significantly more expensive than the 'multiple epitaxy' process. Indeed, the charging, conditioning and cleaning steps are identical and the actual duration of the process is not the main factor driving the higher cost. On the other hand, the 'multiple epitaxy' process provides savings during the column photo technology steps and results in savings related to many deposits for the epi layers of the columns. Also, with multiple epitaxy, the implantation centers which are stacked on top of each other must be vertically merged together with thermal diffusion.

At the same time, the regions are diffused in the same manner also laterally, which leads to a distinct limit that is imposed on the minimum width of the structure. When the columns are doped already during the initial epi process, just like with the trench filling method, there is no need for such a diffusion step, so that a structure which has very narrow columns can be produced and a higher cost-performance ratio can be achieved. However, the integration of doping by using an epi process is possible only with relatively large fluctuations. In particular with very small dimensions, the corresponding fluctuations quickly exceed the window provided for the process, which can lead to significant yield losses. Also, a vertical variation of the doping profile (and thus also of the vertical development of the strength of the field) is not possible. Various robustness criteria therefore cannot be met.

Another conventional technique for fabricating voltage compensation components involves co-doping of the starting material with different quickly diffusing doping atoms followed by trench etching and intrinsic epi filling. However, the problems associated with precise doping are circumvented so that the trench geometry does not change the charging balance. A new characteristic, when compared to the manufacturing concepts discussed so far, is the doping of the epi starting layer. In particular, the epi volume contains both elements $E_p$ (p-type) and $E_n$ (n-type), which later form the p-type and n-type compensation columns in the finished product, although the columns are spatially separated from each other. This 'double doping' can be produced by simultaneously adjusting both of the doping gas currents during the epi growth or so that the entire gas volume consists of a multi-epitaxial sequence, where the doping implantation is not masked and instead both of the doping types are incorporated on the entire surface with the desired doses.

The horizontal levels are merged in the vertical direction with a strong outward diffusion into a continuous (undulating) doped material. Immediately after the starting epitaxy, while both doping materials are not yet spatially separated from each other, they are homogenously distributed in each (intrinsically thin) horizontal layer and mutually compensate for each other or a doping gradient can be built into each of both elements in the vertical direction. As already mentioned, opposite doping polarity must be realized (meaning that one element must have the p-doping effect and the other one must have the n-doping effect. The diffusion coefficients of both doping elements in silicon must be very different with customary diffusion temperatures of around 1,000° C. to 1,200° C. An example of such a doping pair is As (n-doping) and B (p-doping). The diffusion speed of boron is in the given temperature range about three times as high as that of arsenic.

A lateral separation of the doping element in the charge concentration points can be achieved so that the desired doping columns are created by etching a deep trench in the starting epi (which is doped with both doping elements $E_p$ and $E_n$) so that a mesa structure still remains in front of the starting epi. Doing so conserves the horizontal charge balance. An undoped epi layer is then grown on the lateral walls of the trench. This also has no influence on the lateral charge balance. The trench can then be filled at this point. A strong outward diffusion of the doping elements $E_p$ and $E_n$ is carried out after that or at a later point during the process (for example during the device process). Since the diffusion coefficients of both doping elements are very different, a large amount of the doping substance of the faster diffusing element diffuses into the undoped epi layer covering the trench sidewalls. A disproportionally higher ratio of the more slowly diffusing element is diffused into the remaining Si mesa layer. One part of the doping amounts is compensated for intrinsically. This occurs in particular in the remaining Si mesa layer. The non-intrinsically compensated doping substance amounts are electrically active, and are determined for each location by the difference in the concentrations of $E_p$ and $E_n$. This effect also substantially builds the doping column. It follows from the description above that with the homogenous doping of the starting epi, no individual processes including etching of the trench, trench wall depositing with epi and column diffusion change the charge balance relative to the starting status of the double-doped starting epi.

The starting epi co-doping/trench etching/intrinsic epi filling technique yields compensation columns with small dimensions, so that the entire amount of the charge can be used to control with precision the voltage increasing volume. However, with this technique, the n-doping atoms never diffuse in silicon faster than the p-doping elements. The charge separation thus occurs mostly because the $E_p$ atoms are diffused out of the pre-deposed region of the $E_p$ atoms, while the $E_n$ profile is hardly changed at all and therefore is only made slightly fluid. This results in several problems.

First, a higher ratio of p-doping atoms remains in the n-type columns, and although they are intrinsically compensated for with an oversupply of $E_n$, the effect on the silicon grid reduces the electric mobility of the electrons (there are about three times as many doping elements in the n column as there are in the p column where no intrinsic compensation takes place). Therefore, although the breakdown voltage is increased in this manner, since the n column carries the load current in the switched-on status of the transistor, this characteristic increases also the switched-on resistance.

Furthermore, the $E_p$ atoms diffuse faster also in the vertical direction than the $E_n$ atoms, creating a more highly doped p-type region under the n-type column, unless a highly doped substrate layer is located under the column. The n-type column should be coupled so that it is conductive with n-conductive compensation components in the downward direction to the rear side of the device. However, this cannot be achieved (due to the p-layer described above) without additional measures.

Also, in order to ensure the robustness of the compensation component, methods were used which were based on the fact that the amounts of the doping substance were varied in the vertical direction in the p-type column and/or in the n-type column. The goal is to produce an electric peak with about a half of the height of the voltage absorbing volume. For precision reasons, the simplest way to achieve this is when the starting epi layer is manufactured with a multilayered epitaxy. The doping is performed with implantation of $E_n$ and $E_p$ on the entire surface in each individual epi level, and the implantation dose can be varied. With a subsequent diffusion (which occurs still before the etching of the trench), the doping substance is vertically distributed throughout the epi volume and therefore throughout the individual epi regions. In this case, the $E_n$ diffusion is much slower than that of $E_p$. When the $E_n$ doped starting epi is diffused at the same time in the vertical direction, the diffusion must be conducted until the doping elements are homogeneously distributed mostly vertically through the epi volume. A doping profile, which is predetermined with the implantation dose for the individual epi level, is therefore not retained (or only an augmented one may remain). Due to these occurrences, it is very difficult to build a vertical doping profile having a high electric robustness.

There is also the fact that a higher percentage of the $E_p$ atoms are diffused in the vertical direction from the voltage absorbing volume, for example into the low laying substrate. The vertical outward diffusion of the $E_p$ atoms interferes with the horizontal charge balance if no measures are taken against the vertical outward diffusion, such as for example buried oxide layers. The vertical outward diffusion of the $E_p$ atoms also has a detrimental influence on the finishing tolerances.

Another conventional technique for fabricating voltage compensation components involves doping of the trench sidewalls with implantation. That is, defining the p-type compensation columns can be formed with implantation instead of filling the trench. The trench itself can then be filled with a dielectric, or even remain unfilled and then closed up only in the upward direction. However, this technique results in reflection mechanisms at the sidewall of the trench which plays an important role. Further, the location in which the doping substance is inserted depends to a great deal on the angle of implantation and on the geometry of the trench (the window available for the implantation is not sufficiently large). Moreover, this technique also does not make it possible to vary the charge balance or the relationships between the fields which are related to the depth even though this option is important for voltage compensation components, namely in order to ensure the current capability with a full load. Similar performance characteristics are relevant in so-called avalanche switch occurrences.

Another conventional technique for fabricating voltage compensation components involves implantation with ultra high energy. The areas that are based on implantation using extremely high energy amounts in theory capture the increasing voltage volume in a single epi step in the depth of the layer. The p-type columns should then be defined by implantation in several stages using different energy levels through a thick surface mask. The required column depth should be achieved with the very high implantation energy level. However, attempts in these areas have not been successful because a suitable masking process is not available.

SUMMARY

According to an embodiment of manufacturing a voltage compensation structure, the method includes: etching a trench into an epitaxial semiconductor material doped with n-type dopant atoms and p-type dopant atoms having diffusion constants differing by less than 50%; disposing a first semiconductor or insulating material along one or more sidewalls of the trench, the first semiconductor or insulating material having a dopant diffusion constant which is at least 2× different for the n-type dopant atoms than the p-type dopant atoms; disposing a second semiconductor material in the trench along the first semiconductor or insulating material, the second semiconductor material having a different dopant diffusion constant than the first semiconductor or insulating material; and diffusing more n-type dopant atoms or p-type dopant atoms from the epitaxial semiconductor material through the first semiconductor or insulating material into the second semiconductor material than the other type of dopant atoms so that a lateral charge separation occurs between the second semiconductor material and the epitaxial semiconductor material.

According to an embodiment of a voltage compensation structure, the structure includes a first semiconductor or insulating material disposed along one or more sidewalls of a trench formed in a doped epitaxial semiconductor material. The first semiconductor or insulating material has a dopant diffusion constant which is at least 2× different for n-type dopant atoms than p-type dopant atoms. The voltage compensation structure further includes a doped second semiconductor material disposed in the trench so that the first semiconductor or insulating material is interposed between the doped second semiconductor material and the doped epitaxial semiconductor material. The doped second semiconductor material has a different dopant diffusion constant than the first semiconductor or insulating material so that a lateral charge separation occurs between the doped second semiconductor material and the doped epitaxial semiconductor material.

According to an embodiment of a semiconductor device, the device includes an epitaxial material of a first conductivity type, a body region disposed in the epitaxial material which is of the first conductivity type and doped more heavily than the epitaxial material, a source region disposed in the body region and of a second conductivity type opposite the first conductivity type, and a drain region of the second conductivity type vertically offset from the source region so that the epitaxial material and the body region are interposed between the source region and the drain region. A trench is formed in the epitaxial material and a first semiconductor or insulating material is disposed along one or more sidewalls of the trench. The first semiconductor or insulating material has a dopant diffusion constant which is at least 2× different for dopant atoms of the first conductivity type than for dopant atoms of the second conductivity type. A second semiconductor material is disposed in the trench so that the first semiconductor or insulating material is interposed between the second semiconductor material and the epitaxial material. The second semiconductor material is of the second conductivity type and has a different dopant diffusion constant than the first semiconductor or insulating material so that a lateral charge separation occurs between the second semiconductor material and the epitaxial material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

A number of embodiments are explained next. Identical structural features are identified by identical or similar reference symbols in the Figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

Figure 1:
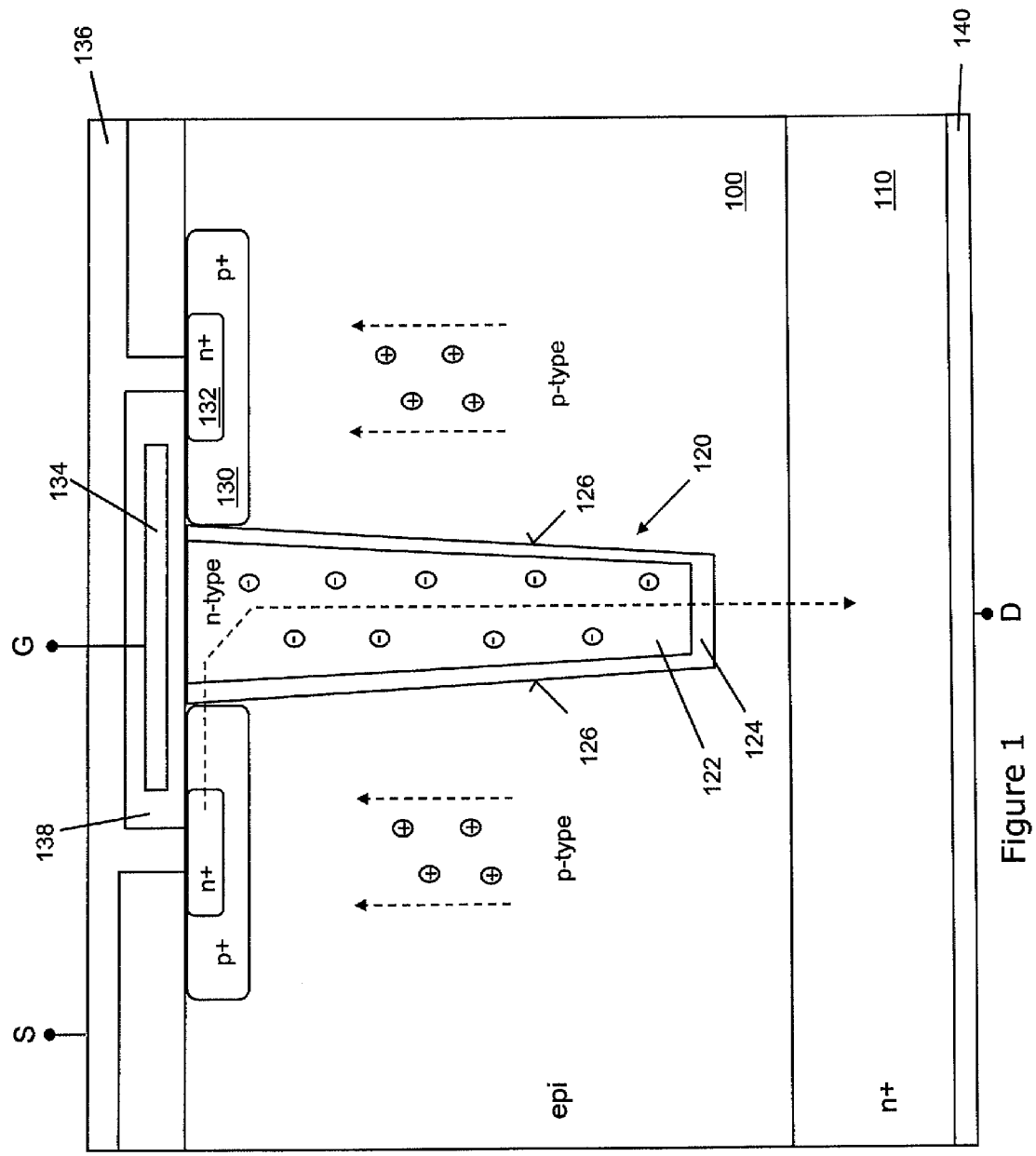
FIG. 1 illustrates a schematic cross-sectional view of a semiconductor device which has a voltage compensation structure according to an embodiment.

FIG. 1 illustrates an embodiment of a voltage compensation structure used with a vertical n-channel power MOSFET. The doping types described herein correspond to an n-channel device, but can be readily reversed for a p-channel device. The compensation structure shown in FIG. 1 in addition to the other compensation structure embodiments described herein can be applied in a similar manner to other types of semiconductor devices. The semiconductor devices which can use such a compensation structure may be manufactured by different technologies and may include, for example, integrated electrical, electro-optical or electro-mechanical circuits or passives. The semiconductor devices may include inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The semiconductor devices which can use a voltage compensation structure as described herein may include power MOSFETs (Metal Oxide Semiconductor Field Effect Transistors), DMOSFETs (Double-diffused MOSFET), IGBTs (Insulated Gate Bipolar Transistors), JFETs (Junction Gate Field Effect Transistors), power bipolar transistors or power diodes such as power Schottky diodes. These types of power semiconductor devices have a vertical structure in that the devices are fabricated in such a way that electric currents can flow in a direction perpendicular to the main faces of these power semiconductor devices. As such, these devices may have terminals such as contacts on two opposing main faces, that is to say on a top side and a bottom side, or, in other words, on a front side and a rear side. By way of example, the source electrode and the gate electrode of a power MOSFET may be situated on one main face, while the drain electrode of the power MOSFET may be arranged on the other main face. The contacts may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible.

Returning to FIG. 1, the MOSFET includes a doped epitaxial (epi) layer 100 grown on n+ substrate 110. The n+ substrate 110 forms a drain region of the device. A trench 120 filled with n-doped semiconductor material 122 forms a drift zone of the device. A p+ body region 130 is formed in the epi layer 100, and an n+ source region 132 is formed in the p+ body region. A gate electrode 134 is disposed over a channel region of the MOSFET and coupled to a gate potential (G). A source electrode 136 is insulated from the gate electrode 134 by a dielectric 138, and couples the n+ source region 132 to a source potential (S). At the opposite side of the device is a drain electrode 140 which couples the n+ substrate (drain region) 110 to a drain potential (D).

The on-state resistance of a conventional high voltage power MOSFET is dominated by the on resistance (Rds_on) of the voltage sustaining drift zone, and the blocking capability of this region is determined by its thickness and doping. In order to advantageously increase the blocking voltage, the doping of the drift zone is conventionally reduced and the layer thickness increased. Doing so conventionally increases the on-state resistance disproportionately in this region as a function of its blocking capability.

When blocking occurs, the voltage is absorbed by the structural components in such a way that the neighboring p-type and n-type regions are mutually cleared up, which is to say that the charge carriers of one region electrically compensate for those in the oppositely doped regions (hence the term compensation structure). Therefore, a capacity is built up in the form of one of the zones which is provided with the depleted zone of the free charge carriers (space charge zone). This induces an electric field in the individual levels with small voltages, which mostly have a horizontal orientation. With increased voltage, a growing part of the volume is horizontally cleared up under the device until at least one of the charge columns arranged next to each other is fully depleted. The horizontal electric field Eh reaches a maximum (EBh). When the voltage is further increased, the clearing up of the n+ charge substrate or deepest deployed surface of the epi layer begins. As a result, the vertical field Ev builds up again (which up until that point did not provide a considerable contribution to the field). The breakdown is reached, and it takes the form of a vertical field with the value EBv for which the following is valid:

$$E_c = |\vec{E}_{Bv} + \vec{E}_{Bh}| \Rightarrow E_{Bv} = \sqrt{E_c^2 - E_{Bh}^2} \quad (1)$$

With corresponding dimensions of the cell, even with very high column doping amounts which provide lower Rds_on, the horizontal field EBh displays only relatively low values so that EBv is on the order of Ec. Therefore, based on:

$$U_B(E_{Bv}, E_{Bh}) = U_{Bv}(E_{Bv}) + U_{Bh}(E_{Bh}) \quad (2)$$

a structural component constructed in this manner can block high voltages in spite of the low switching resistance Rds_on while Rds_on is limited in conventional power components as given by:

$$R_{on} \propto (U_B)^{2.4\ldots2.6} \quad (3)$$

According to the embodiments described herein, the device has a trench 120 filled with n-type doped semiconductor material 122 which forms an n-type column in the epi layer 100. The doping of the n-type column 122 is increased compared to conventional devices (e.g. from n− to n or even higher) to reduce Rds_on in this region. The n-type column 122 provides a vertical current flow path between the source and drain in the on-state. The on-state performance of the transistor is improved by increasing the doping of the n-type column 122.

The epi material 100 which surrounds the n-type column 122 is doped p-type to form a voltage compensation structure. In the blocking state, compensation of additional charge is provided by the p-type doped epi material 100 which surrounds the n-type 122 column as indicated by the flow of electrons (−) and holes (+) shown in FIG. 1. In some embodiments, half of the active chip area can be covered by the p-type doped epi material 100. During blocking, the p-type doped epi material 100 compensates the charge of the adjacent n-type column 122 which results in a high breakdown voltage at an area specific on-resistance below the silicon limit. Lower on-state resistance is provided without decreasing the blocking voltage capacity of the device by disposing the trench 120 with the n-type column 122 in the p-doped epi material 100.

The trench 120 also includes a semiconductor or insulating material 124 disposed along sidewalls 126 of the trench 120, which is referred to hereinafter as trench sidewall material. The n-type column 122 in the trench 120 is also referred to hereinafter as trench fill material. The trench sidewall material 124 is interposed between the trench fill material 122 and the surrounding p-doped epi material 100.

The trench sidewall material 124 has a dopant diffusion constant which is at least 2× different for n-type dopant atoms (such as P) than p-type dopant atoms (such as B). Also, the trench fill material 122 can have a different dopant diffusion constant than the trench sidewall material 124. The dopant diffusion constants in the trench fill material 122 and in the epi material 100 are usually the same because in general they are of the same material. Of course different materials could be used, resulting in different dopant diffusion constants in the trench fill material 122 and in the epi material 100. One of n-type dopant atoms or p-type dopant atoms diffused in a much higher concentration from the epi layer 100 to dope the trench fill material 122 as compared to the other dopant type during a previous diffusion process. The trench sidewall material 124 prevented at least effectively as possible the other dopant type from diffusing into the fill material 122 so that dopant atoms of one type mostly diffused from the epi material 100 into the trench fill material 122 and dopant atoms of the other type mostly diffused in the surrounding epi layer 100. A lateral charge separation therefore occurs between the trench fill material 122 and the surrounding doped epi material 100, and enables the vertical current flow path (which flows e.g. in the n-type column 122 for an n-channel device) to have a lower on resistance without reducing the voltage blocking capacity of the device.

In one embodiment, the trench sidewall material 124 is SiGe or SiGeC and the trench fill material 122 is Si epitaxy which is doped n-type after the diffusion process described above. The Si epitaxy is initially undoped (at least unintentionally in that some unintended doping may occur during the trench fill epitaxy process). During the subsequent diffusion process, the Si trench material 122 becomes dominantly n-doped because the SiGe or SiGeC trench sidewall material 124 prevents most of the boron atoms from diffusing into the Si trench material 122. In another embodiment, the trench sidewall material 124 is an insulating material such as $SiO_2$ for example.

Figure 2:
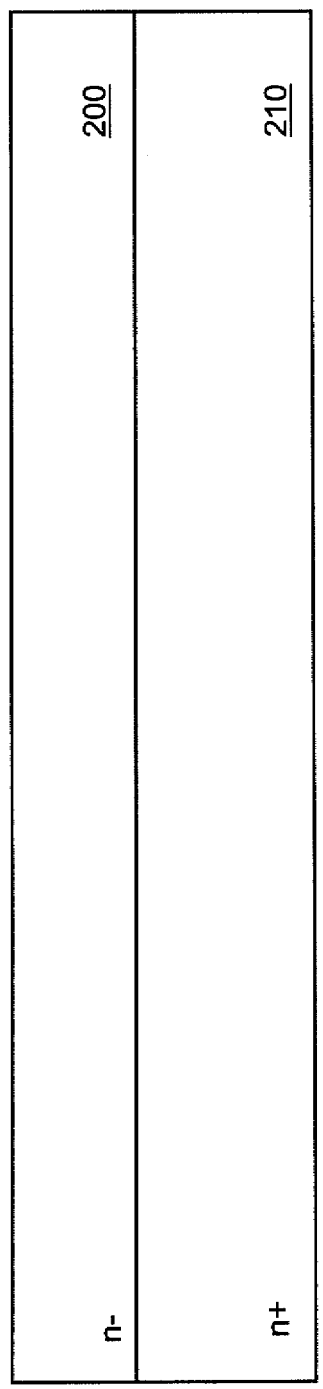
FIGS. 2-11 illustrate a method of manufacturing a voltage compensation structure.

FIGS. 2-11 illustrate an embodiment of a method of manufacturing the voltage compensation structure. The method is described next in the context of an n-channel device, but applies equally to p-channel devices (with the doping types reversed). With this understanding, a preferably nearly intrinsic Si epitaxial layer 200 is grown on an n+Si substrate 210 as shown in FIG. 2. Additionally, an n-type buffer or field stop layer can be disposed between the highly doped substrate 210 and the epi layer 200. Furthermore, a low doped region with the same doping type as the highly doped substrate 210 can be disposed between the compensation zones and the substrate/field stop layer.

Figure 3:
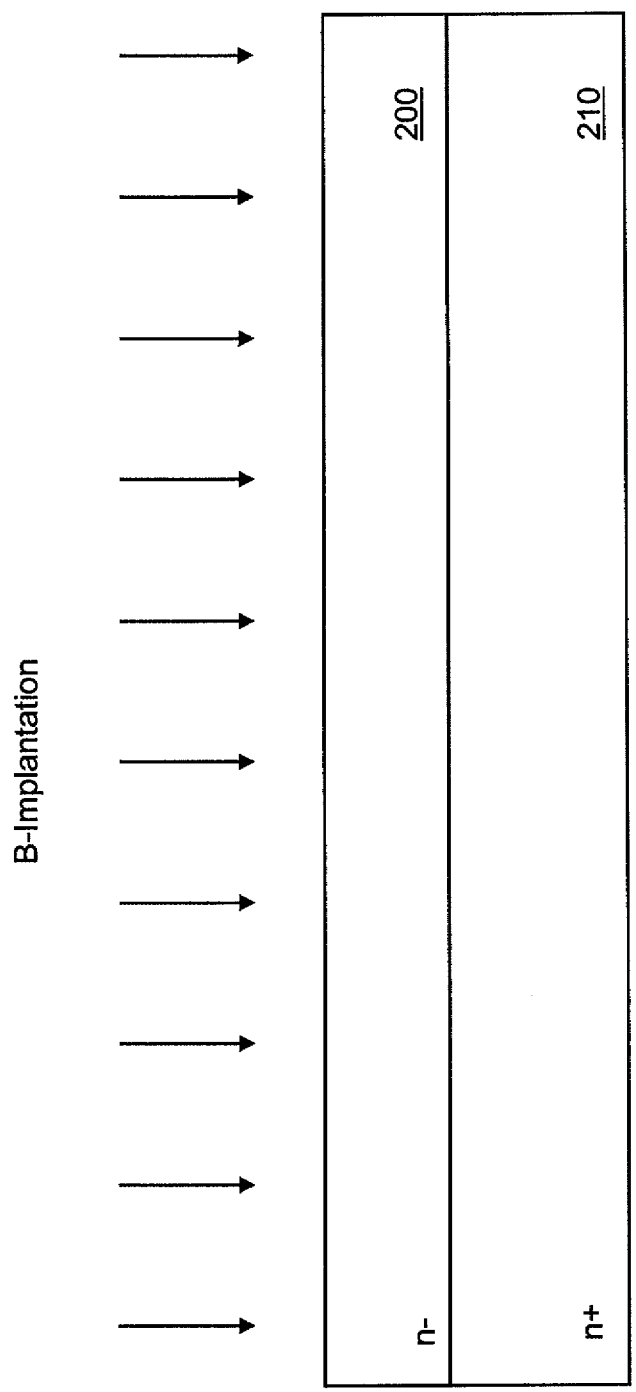
Figure 4:
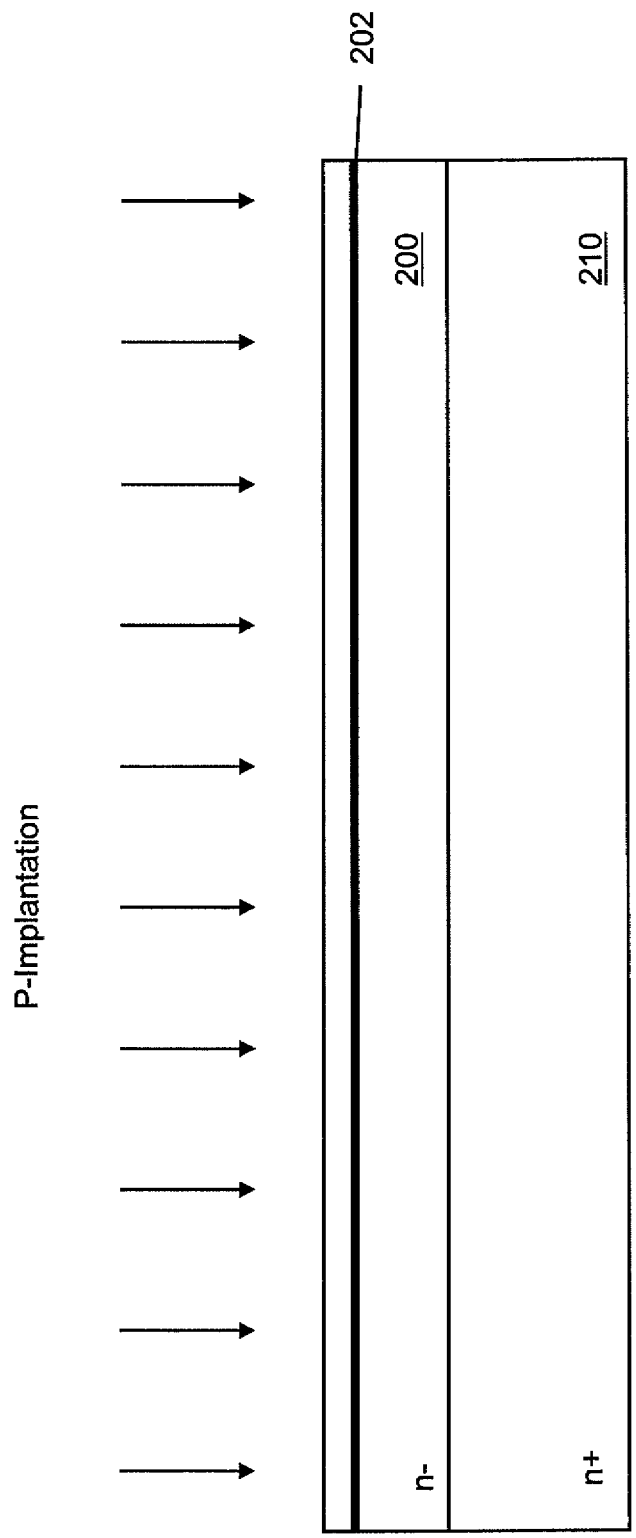
Figure 5:
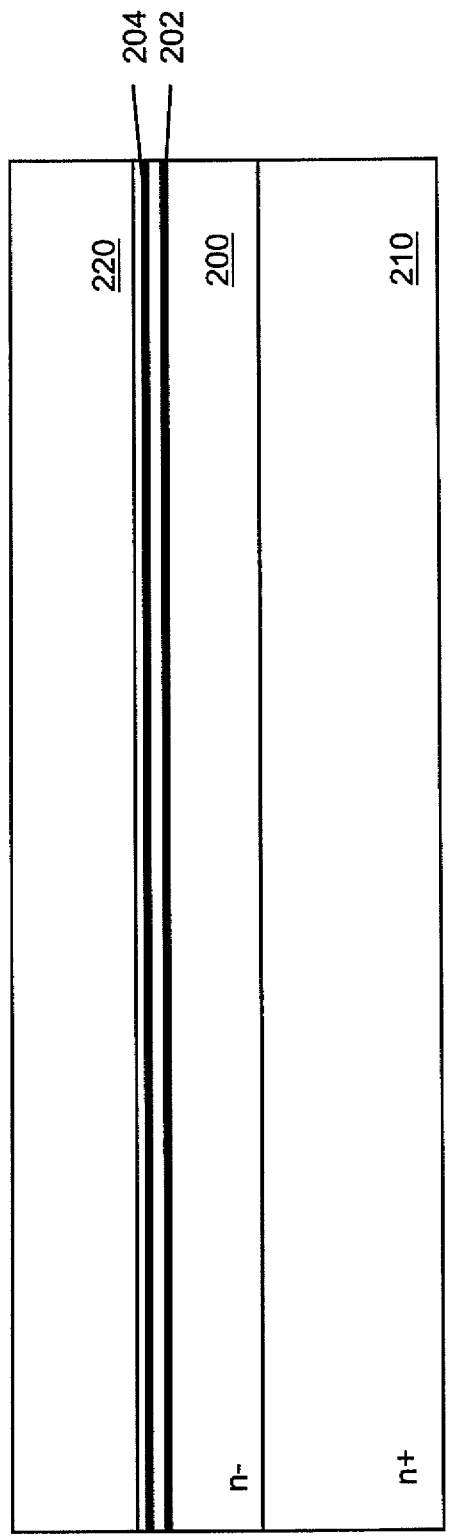

Next, p-type dopant atoms such as boron atoms are implanted into the top surface of the Si epi layer 200 as shown in FIG. 3. Photomasking is not needed during the boron implantation. After implantation, the Si epi layer 200 contains a homogenous distribution of p-type dopant atoms 202 as shown in FIG. 4 and is therefore fully compensated. Additionally, n-type dopant atoms such as phosphorous atoms are implanted into the top surface of the Si epi layer 200 also as shown in FIG. 4. The same dose may be used for the n-type dopant atoms as for the p-type dopant atoms e.g. between $10^{12}$ to $10^{14}$ atoms/cm$^2$. Alternatively, different doses can be used to control the vertical profile of the semiconductor device. By controlling the vertical profile as desired, the electric field profile is correspondingly controlled. Photomasking again is not needed during the phosphorous implantation, and the Si epi layer 200 contains a homogenous distribution of implanted n-type dopant atoms 204 above the implanted region of p-type dopant atoms 202 as shown in FIG. 5. The p-type and n-type implanted regions 202, 204 can be at the same depth, or at different depths as shown in FIG. 5.

Figure 6:
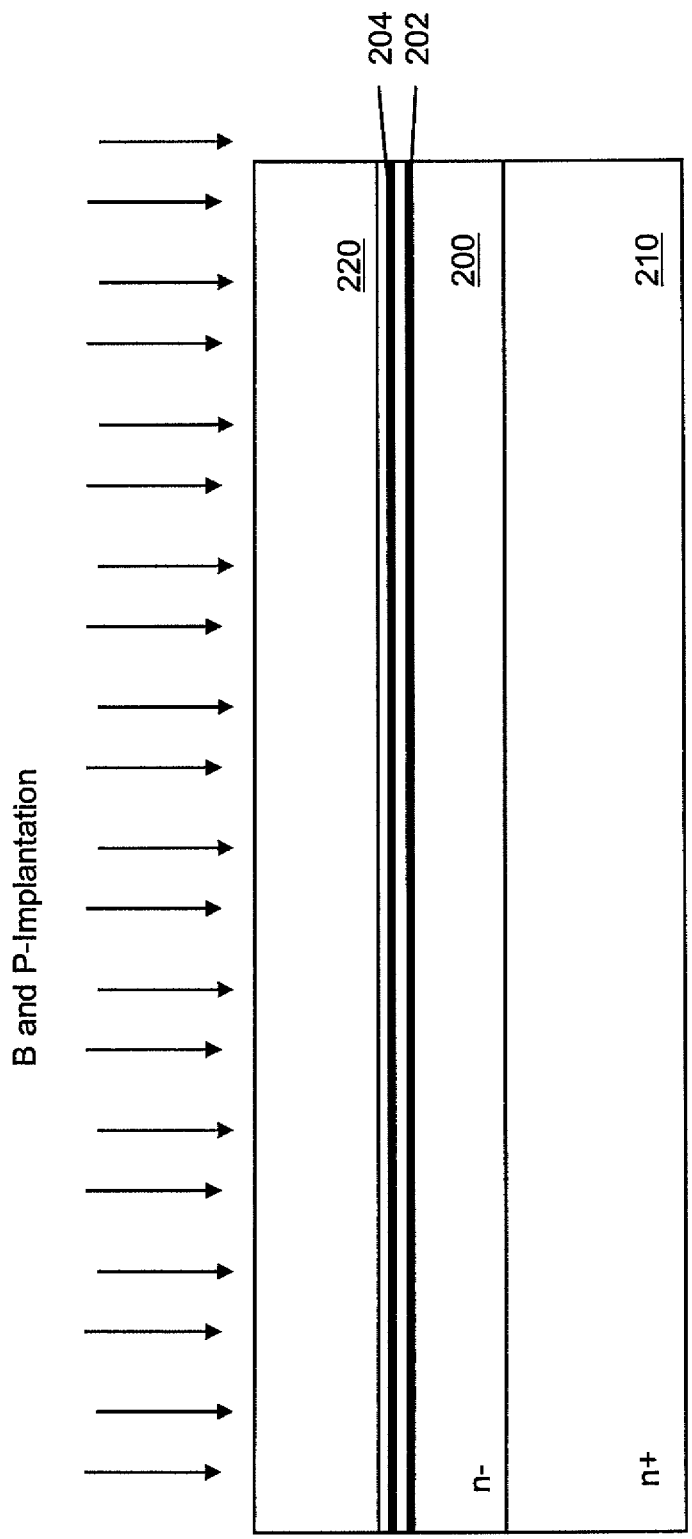
Figure 7:
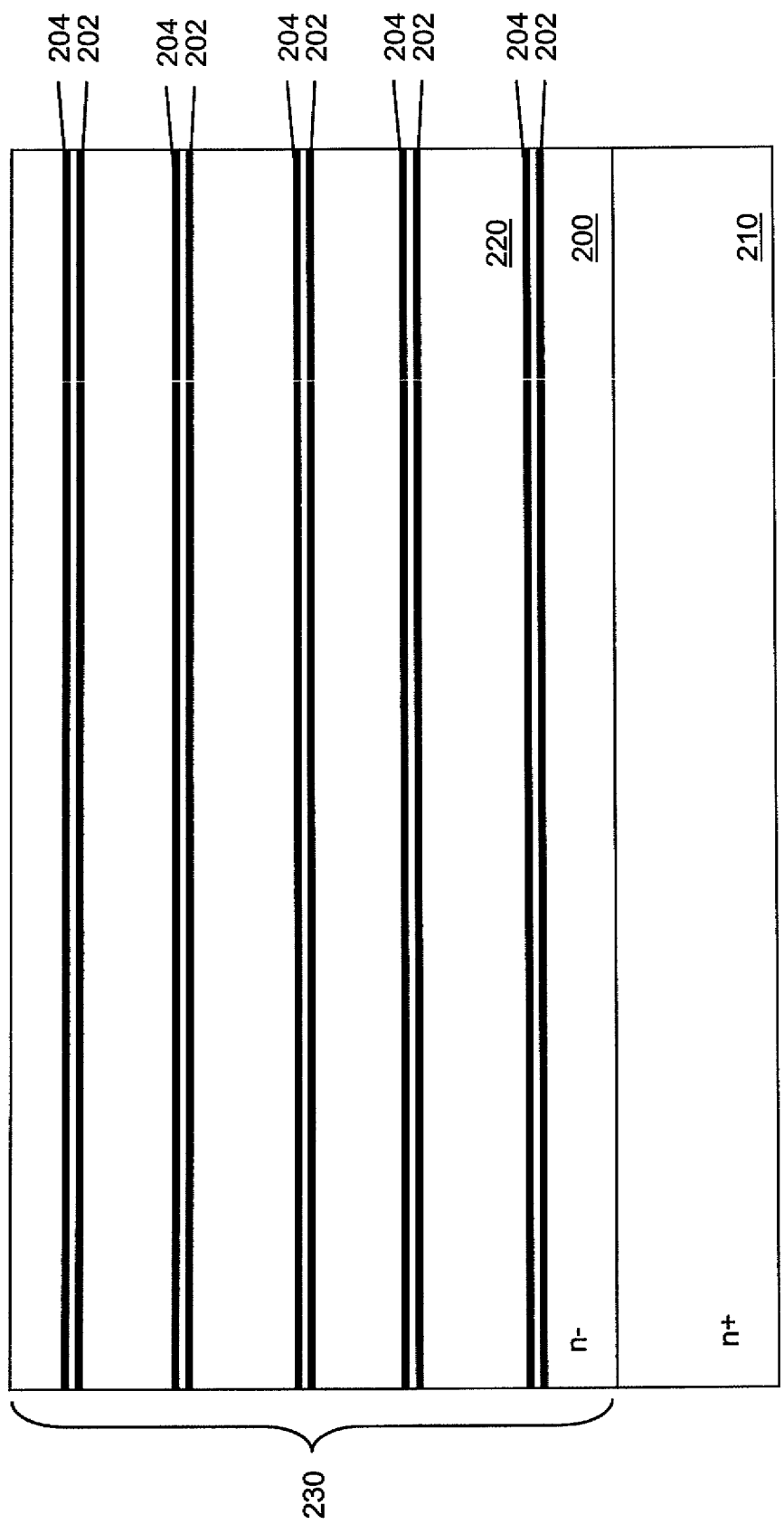
Figure 8:
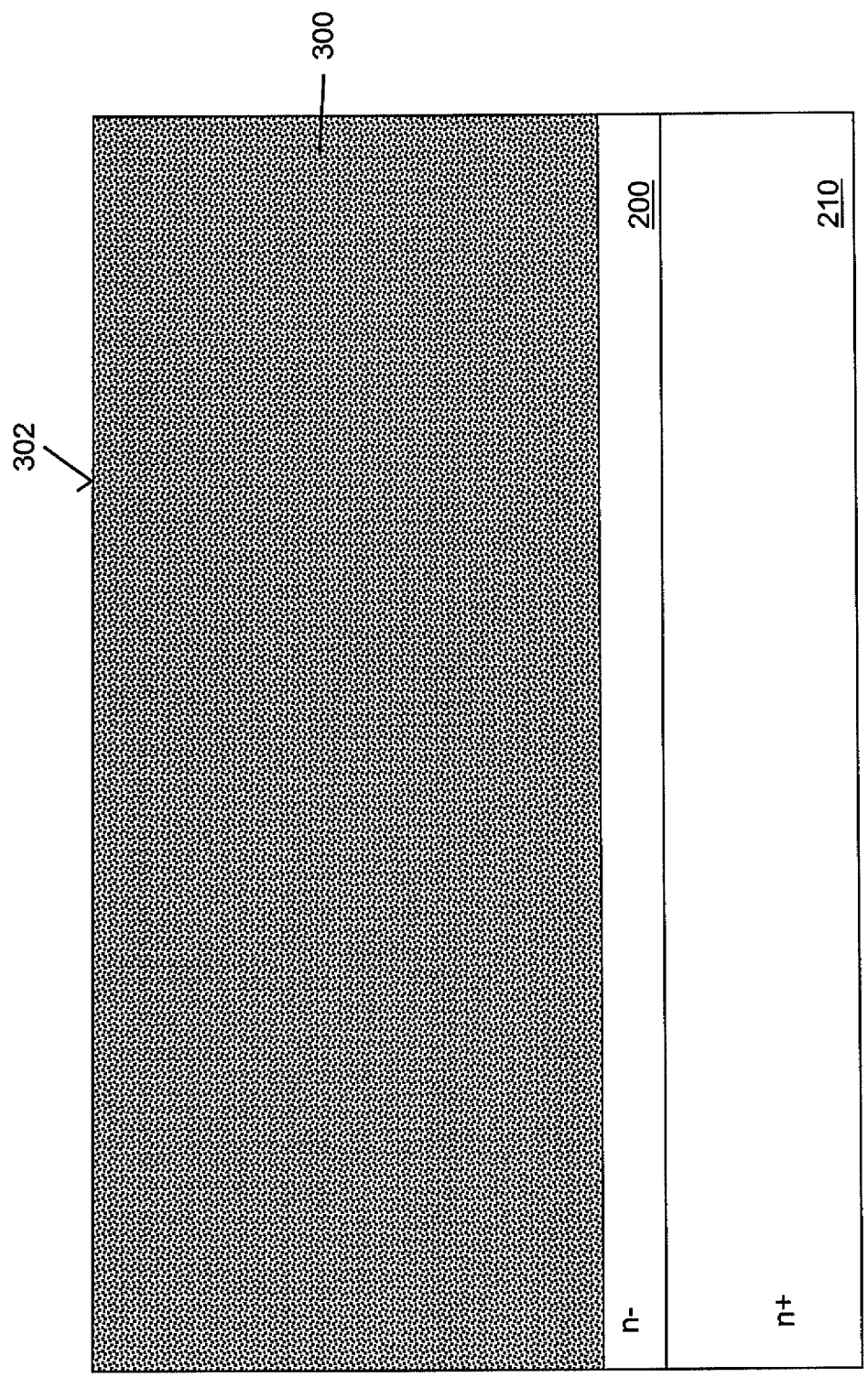

A second Si epi layer 220 is then grown on the original Si epi layer 200 as shown in FIG. 6. P-type and n-type implantation, at the same or different doses as before, is performed again for the second Si epi layer 220 as shown in FIG. 6. The epi growth and implantation processes can be repeated a desired number of times until a suitably thick multilayered epi layer 230 with vertically stacked n-type and p-type dopant regions 202, 204 is realized as shown in FIG. 7. With such a multilayered epitaxy 230, the implantation doses can be varied in each separate Si epi layer which is then followed by a diffusion of the individual implanted regions 202, 204 until the entire multilayered epi 230 is penetrated with an undulating doping substance as shown in FIG. 8. That is, the outdiffusion of the implanted dopant regions 202, 204 formed in the different Si epi layers yields a co-doped multilayered epi 300 having a homogeneous distribution of p-type and n-type dopant atoms throughout because the doping element pair (En and Ep) quickly diffuses in Si approximately equally. The diffusion constants of the implanted p-dopant and n-dopant atoms should be nearly equal i.e. the diffusion constants should not differ by more than 50%, and preferably by less than 20%. For this, boron and phosphorous are suitable dopant atoms. The epi volume is therefore fully compensated. An alternative to the multilayered epi process described above involves using a single continuous epi layer and providing doping gas currents that form an epi material which is fully compensated as described above. In either case, a homogenously co-doped epi material 300 is achieved. Alternatively, the doses of one or more of the n-type and/or p-type regions 202, 204 can vary over at least a part of the vertical depth of the multilayered epi 230 so that a corresponding vertical profile is defined as previously described herein.

In one embodiment, the co-doped epi material 300 is doped homogenously with the n-type dopant atoms and the p-type dopant atoms in the lateral direction extending parallel to a main surface 302 of the epi material 300 so that the epi 300 has a dopant variation of less than 3% or more preferably less than 1% in the lateral direction. The epi material 300 can be doped non-homogenously in the vertical direction extending perpendicular to the main surface 302 so that the dopant variation in the vertical direction is greater than 1% and less than 50%. This way, there is little variation in the dopant concentration in the lateral direction and a much greater variation in the vertical direction. As a result, certain regions of the co-doped epi material 300 can be doped more heavily that others e.g. to provide a breakdown structure within the drift zone of the device. Indeed, a doping variation in the vertical direction may be desirable to increase the breakdown robustness of the device. For example, the epi layer(s) in about half the depth of the drift zone shown in FIG. 7 may be doped more heavily than the lower epi layers to form a breakdown structure at the upper surface 302 of the device after diffusion. In each case, the co-doped epi material 300 is nearly fully compensated in that a dopant concentration difference of less than 10 to 20% is realized throughout the entire epi volume.

Figure 9:
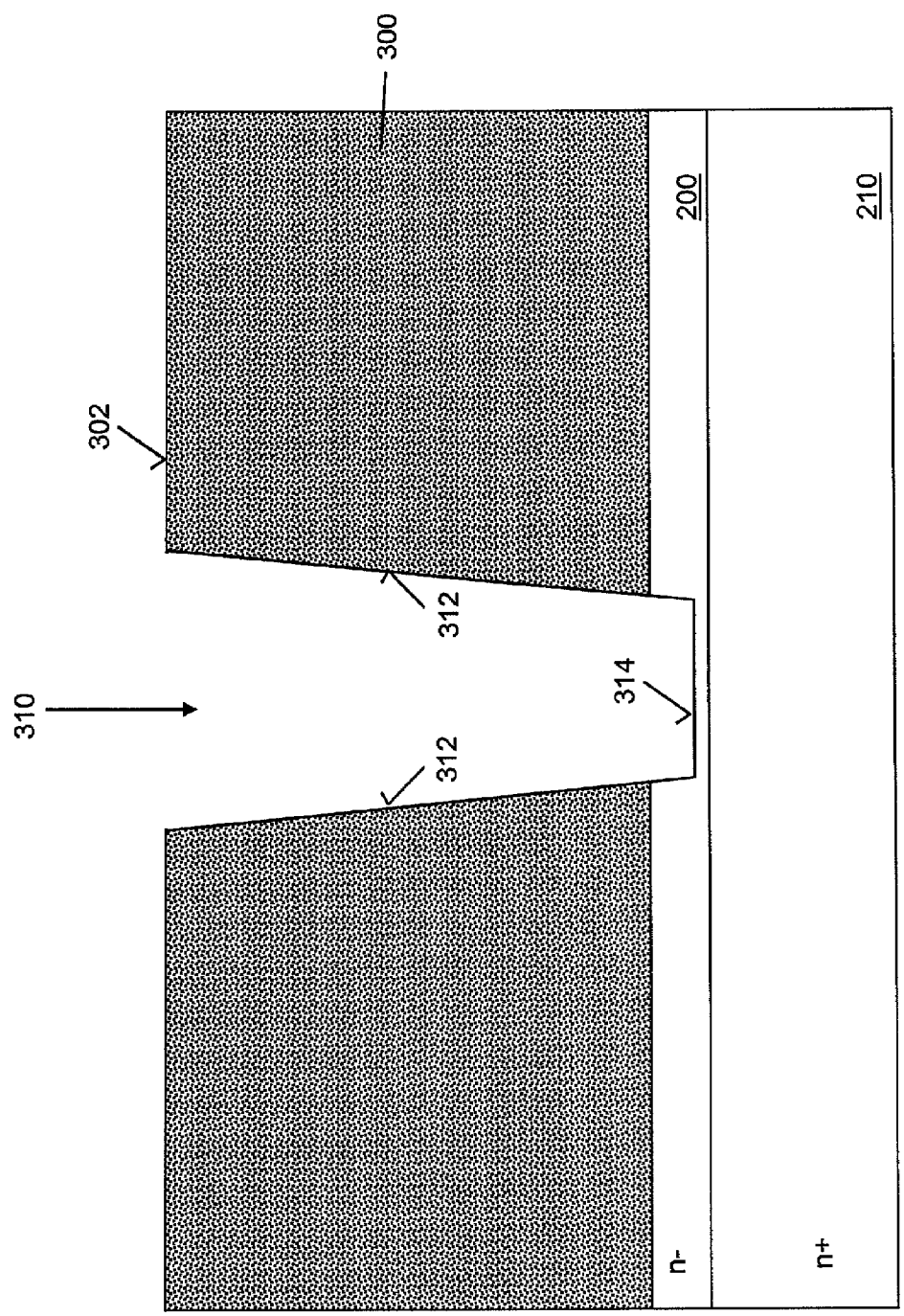

After forming the co-doped epi material 300, a volume profile is defined again by etching a trench 310 with sidewalls 312 and a bottom 314 into the co-doped epi material 300 as shown in FIG. 9. In one embodiment, the trench etching process is stopped prior to reaching the substrate 210.

Figure 10:
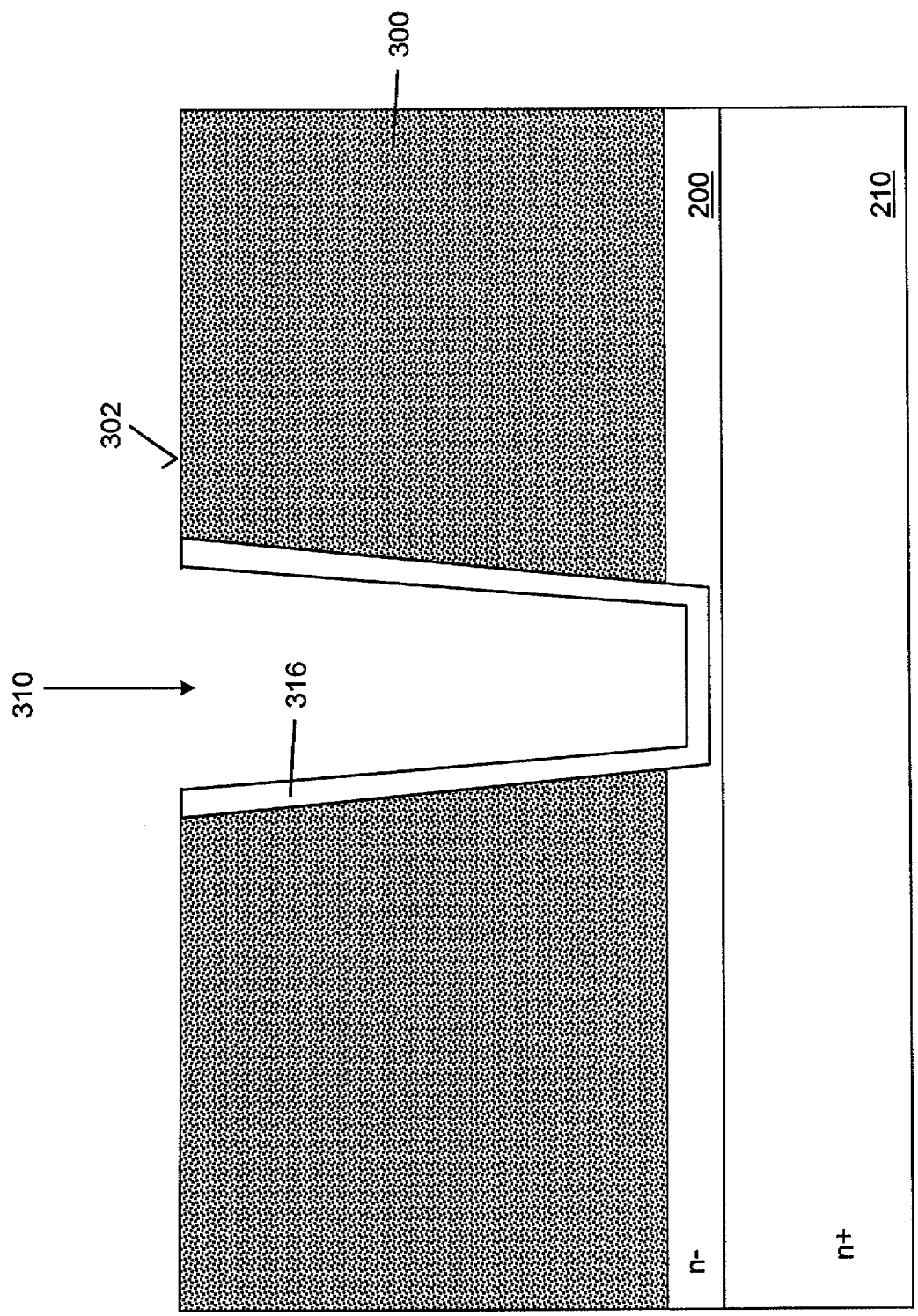

A semiconductor material 316 (also referred to herein as trench sidewall material) is then deposited along one or more of the trench sidewalls 312 as shown in FIG. 10. The trench sidewall material 316 conforms to the trench sidewalls 312 and preferably does not contain any electrically active doping or at least as little as possible. In one embodiment, the trench sidewall material 316 is a semiconductor material which preferably does not act as a doping material with silicon. The trench sidewall material 316 can be deposited on silicon without dislocation in that no (or few) crystalline defects are produced in the neighboring silicon. The trench sidewall material 316 has very different diffusion constants for n-type (En) and p-type (Ep) dopant atoms as compared to silicon for customary process temperatures. In one embodiment, the trench sidewall material 316 has a dopant diffusion constant which is at least 2×, or at least 3×, or at least 5× different for n-type dopant atoms than p-type dopant atoms. As such, the trench sidewall material 316 readily permits the diffusion of one type of dopant atom and acts as a diffusion barrier for the other dopant type. In one embodiment, the trench sidewall material 316 diffuses En faster than Ep.

If phosphorus and boron are used to co-dope the epi material 300, SiGe can e.g. be used for the trench sidewall material 316. In silicon, phosphorous and boron diffuse under the usual process conditions at approximately the same speed. In SiGe however, the n-doping element phosphorus displays a distinctly higher diffusion constant than p-doping element boron. For example, $Si_{0.76}Ge_{0.24}$ displays a diffusion constant for phosphorus that is about one order of magnitude higher than for boron, and the same effect is displayed also for boron as with a diffusion stop layer. SiGe can be epitaxially grown in a conformal manner on the trench sidewalls 312. However, grid defects due to lattice mismatching are created which leads to crystalline defects when the critical thickness is exceeded (which is between several nm and several 10 nm depending on the content of Ge). By doping the SiGe trench sidewall material 316 with a small amount of carbon (e.g. about 1%), a perfect (or near perfect) matching with silicon is achieved with a correct composition of the SiGe grid. SiGeC as the trench sidewall material 316 therefore yields no differences in the grid constant. SiGe and SiGeC have an inert conduct toward the Si crystal, meaning that the charge balance that was adjusted with boron is not distorted.

Figure 11:
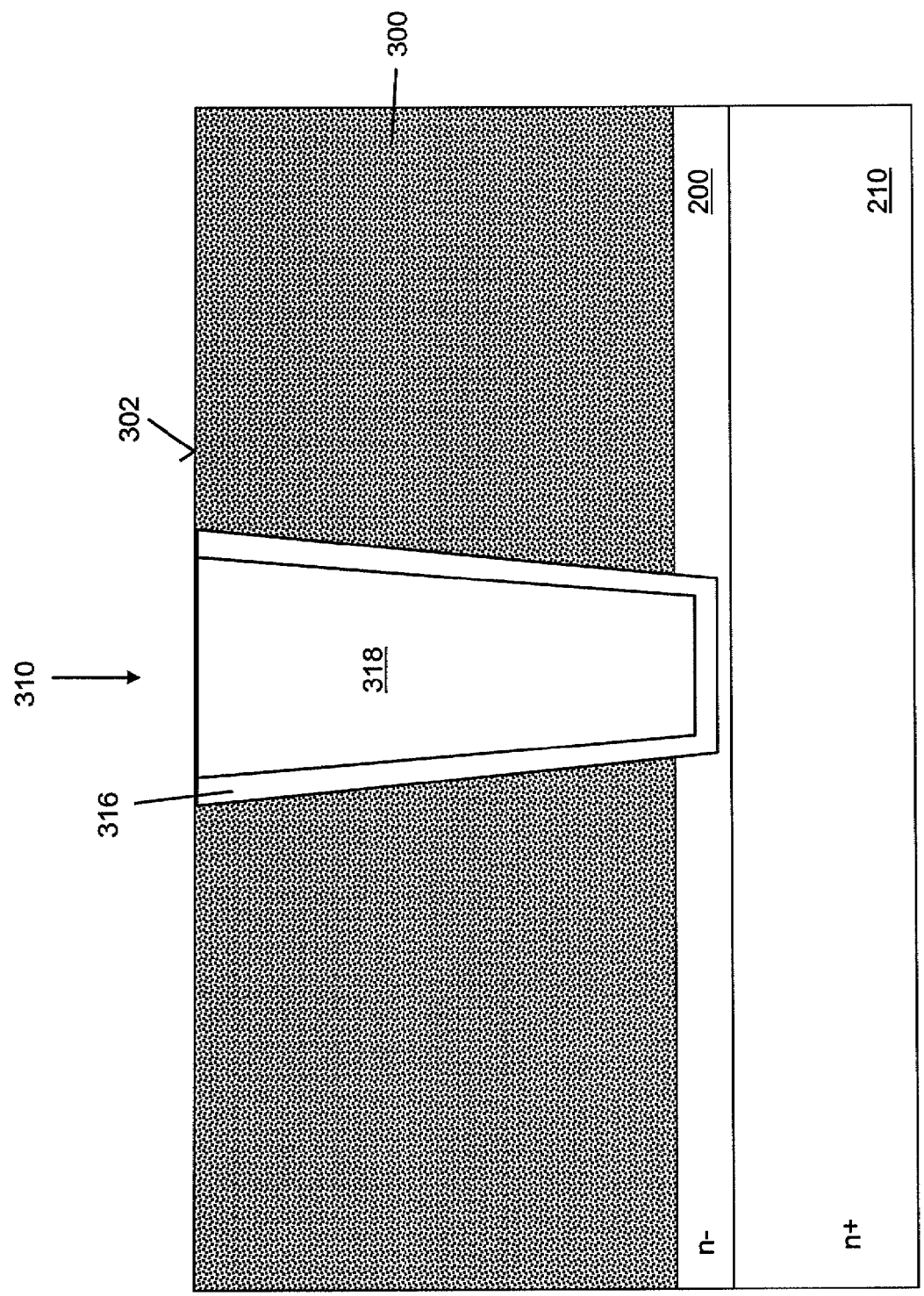

The remaining trench volume is filled with a semiconductor material 318 (also referred to herein as trench fill material) as shown in FIG. 11. The trench fill material 318 has a different dopant diffusion constant than the trench sidewall material 316. In one embodiment, the trench fill material 318 is intrinsic silicon grown using a suitable epitaxy process so that the trench fill material 318 is free of shrink holes. In one embodiment, the trench sidewalls 312 are provided with a slight taper to further reduce shrink holes in the trench fill material 318. The trench fill material 318 is preferably undoped so that the well controlled charge balance obtained in the co-doped epi material 300 surrounding the trench 310 is not disturbed. The trench fill material 318 is considered undoped in that it is not intentionally doped, but may have some unintentional doping which is inherent with epitaxial growth processes.

In a subsequent diffusion process, the vertical charge balance which was adjusted in advance is retained in the starting Si epi material 300 because the diffusion elements En and Ep are discharged with the same speed in the vertical direction in silicon, and in particular because an almost homogenous doping profile (which is to say with little undulation) was previously realized with the adjustment due to the vertical diffusion performed in advance as previously described herein. On the other hand, charge separation occurs in the lateral direction in that the p-type dopant atoms and the n-type dopant atoms are separated in the lateral direction, forming a voltage compensation column structure e.g. as shown in FIG. 1.

Charge separation occurs in the lateral direction because the trench sidewall material 316 strongly blocks the diffusion of one dopant type (e.g. p-type dopant atoms) while readily permitting the diffusion of the other dopant type (e.g. n-type dopant atoms). As such, most of one implanted species (e.g. the n-type dopants) diffuses into the trench fill material 318 while the other implanted species (e.g. the p-type dopants) diffuses only in the surrounding epi material 300. In this example, the trench fill material 318 is dominantly doped n-type to form a current flow path for an n-channel device and the surrounding epi material 300 is dominantly doped p-type to provide voltage compensation by removing free charge carriers from the drift zone e.g. as shown in FIG. 1. The doping types are reversed for a p-channel device. In each case, the on resistance of the current flow path is reduced without adversely affecting the voltage blocking capacity of the device.

In one embodiment, the trench sidewall material 316 is $Si_{0.81}Ge_{0.19}$ and the diffusion temperature is about 950° C. Under these conditions, the diffusion constants (D) of phosphorous (P) and boron (B) are $D_P$=2E-14 $cm^2$/s and $D_B$=4E-15 $cm^2$/s, respectively. At these conditions and for a diffusion duration of about 5 hours, the diffusion length of boron is approximately 170 nm and the diffusion length of phosphorous is approximately 380 nm. If the thickness of the $Si_{0.81}Ge_{0.19}$ trench sidewall material 316 is less than 380 nm and greater than 170 nm (e.g. about 200 nm thick), lateral charge separation occurs as described above. That is, phosphorus atoms laterally diffuse greatly in the $Si_{0.81}Ge_{0.19}$ trench sidewall material 316 during the same time period, so that a very high percentage of the phosphorus content is diffused from the doped epi layer 300 into the trench fill material 318 (e.g. undoped Si epitaxy). Conversely, the $Si_{0.81}Ge_{0.19}$ trench sidewall material 316 prevents most of the boron atoms from diffusing into the trench fill material 318 from the surrounding epi layer 300. Accordingly, an n-type column is formed in the trench 310 and the surrounding epi material 300 becomes p-type e.g. as shown in FIG. 1. The dimensions given above indicate a very finely dissociated structure is possible and that a cell grid of 3 μm can be achieved.

Figure 12:
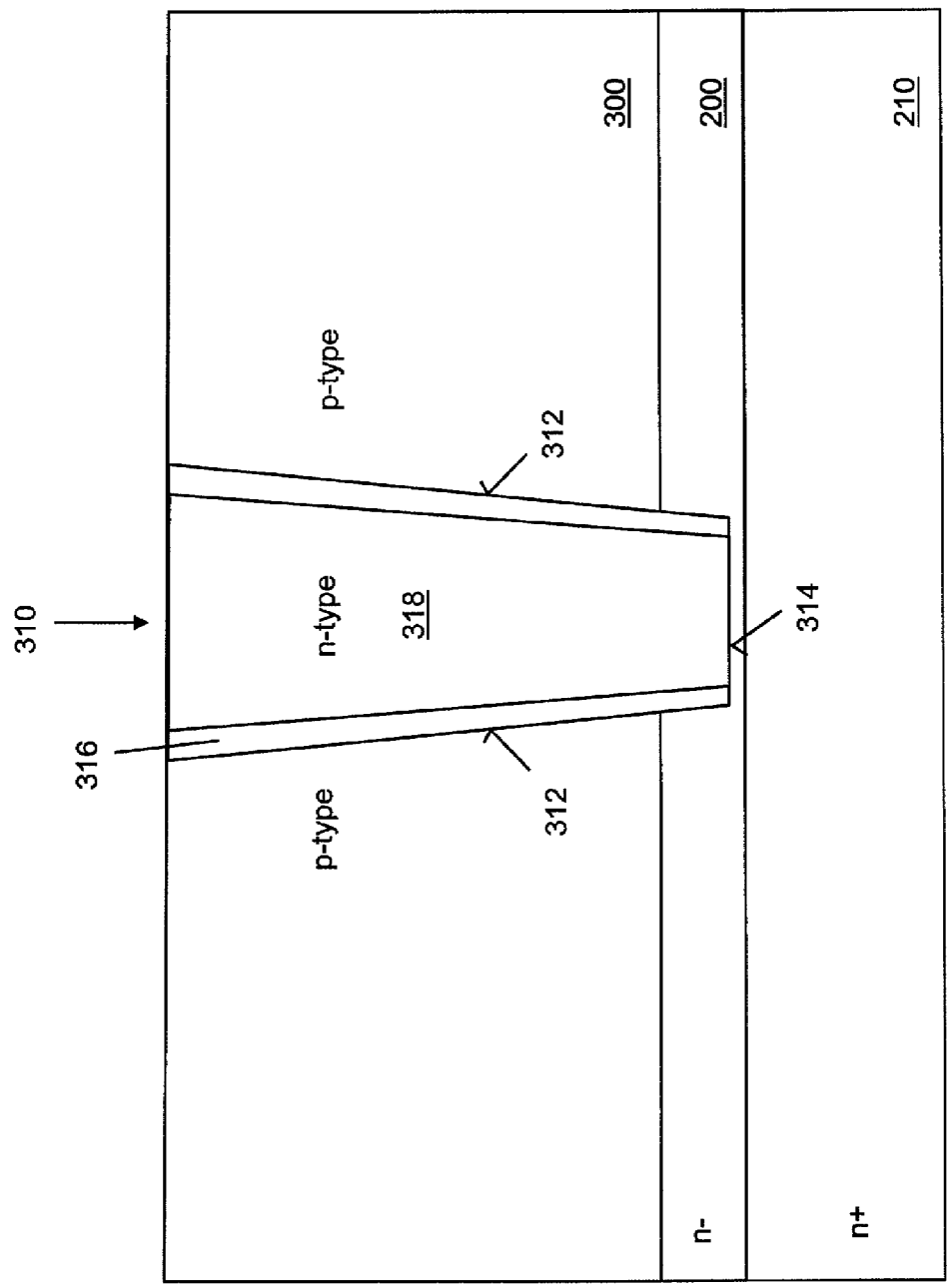
FIG. 12 illustrates a schematic cross-sectional view of a voltage compensation structure according to an embodiment.

To form the trench sidewall and fill materials 316, 318, a SiGe or SiGeC layer can be deposited on the trench sidewalls 312. Alternatively, the trench 310 can be filled with SiGe or SiGeC and then removed except along the sidewalls 312. The trench is then filled with Si. SiGe or SiGeC can be removed at the trench bottom 314 with anisotropic etching. This way, the trench bottom 314 is free from the trench sidewall material 316 as shown in FIG. 12.

Figure 13:
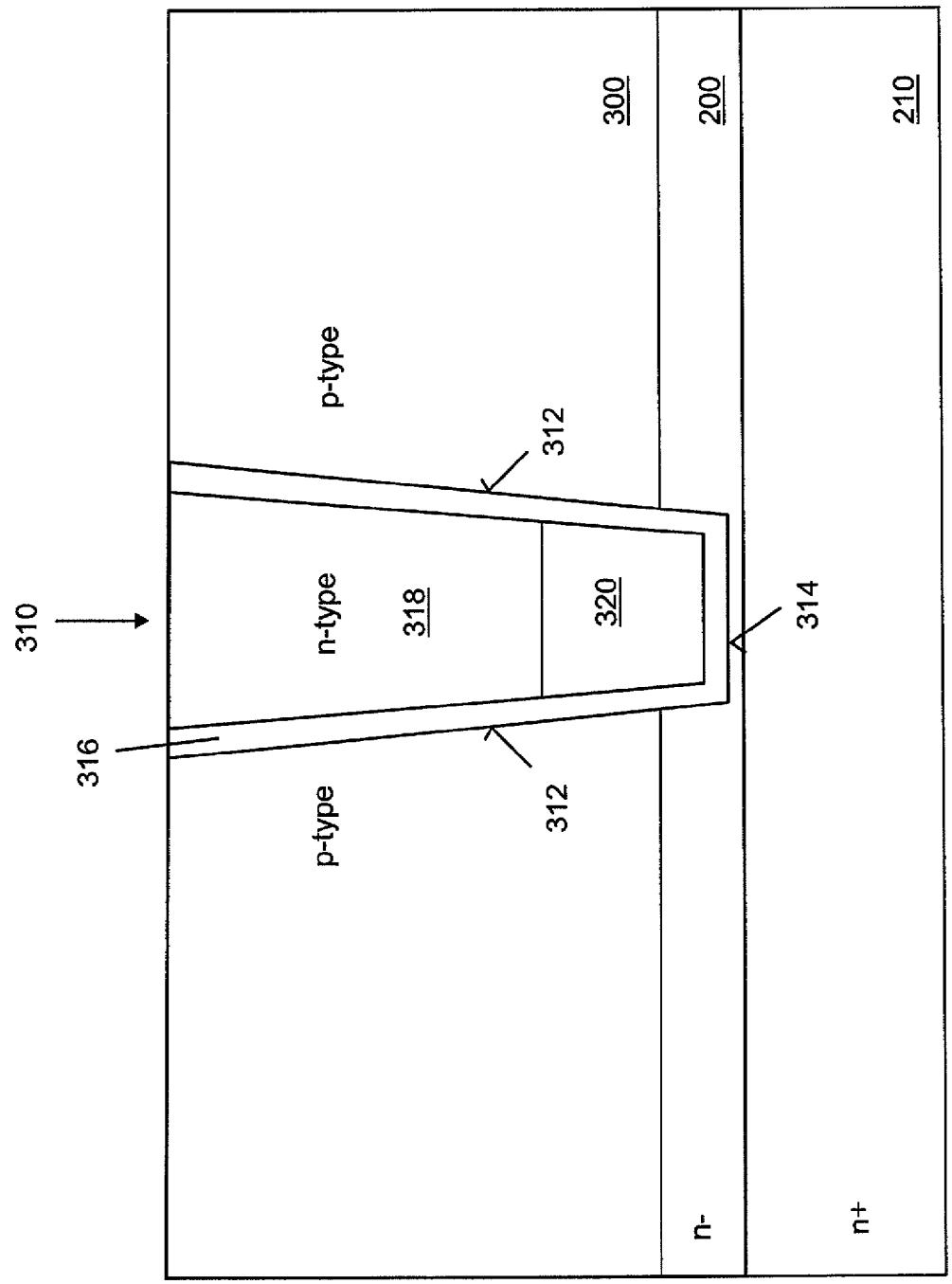
FIG. 13 illustrates a schematic cross-sectional view of a voltage compensation structure according to another embodiment.

FIG. 13 illustrates an embodiment of the trench 310 partially filled with a dielectric 320 such as an oxide. Voids can remain in the trench 310.

Figure 14:
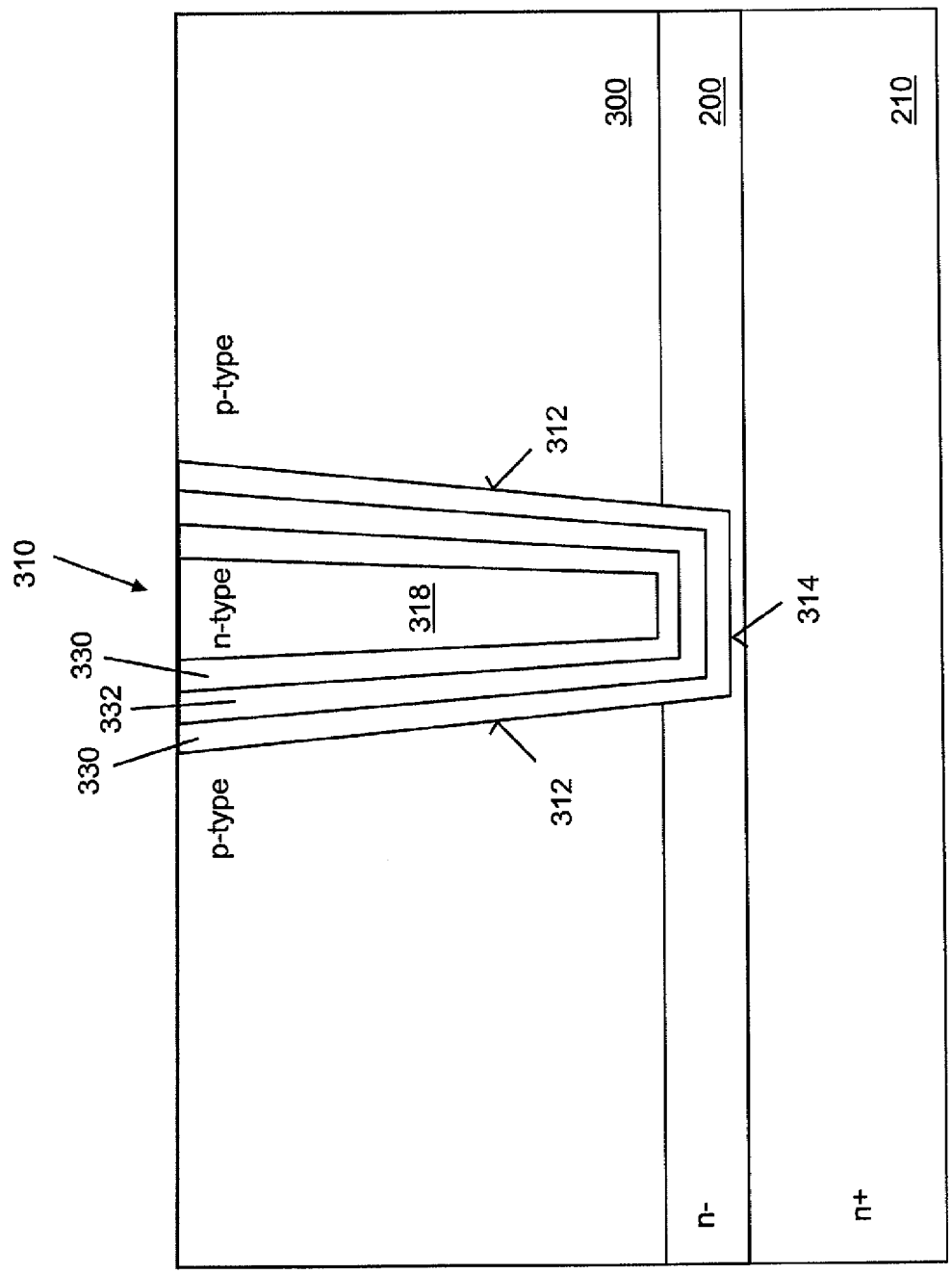
FIG. 14 illustrates a schematic cross-sectional view of a voltage compensation structure according to yet another embodiment.

An oxide could also be used as an alternative or as a supplement for an osmosis layer in the trench 310. One layer of the trench sidewall material 316 can also be used as an osmosis layer. In one embodiment, the trench sidewall material 316 includes a multilayer of alternating SiGe and Si layers 330, 332 as shown in FIG. 14. Such a multilayered trench sidewall material 316 can be used to realize an osmosis layer which has a corresponding thickness even without the addition of carbon, and without generating matching issues due to grid errors. Such an osmosis layer can also be realized when the germanium (Ge) content of an SiGe layer trench sidewall material 316 is at first slowly increased continuously (or in stages) during sidewall separation and then reduced toward the end of the separation process. This way, the Ge content of the SiGe trench sidewall material 316 increases extending inward from the sidewalls 312, peaks, and then decreases. With an osmosis layer interposed between first and second semiconductor materials in a horizontal direction parallel to the main surface of the structure, the first semiconductor material acts as a source for the diffusing elements and the second semiconductor material is the target for the diffusing elements which pass through the osmosis layer. The combination of Si with another material along the conductive path, such as for example with SiGe, provides another advantage in that a grid stress is created which increases the mobility of the electrons and thus further reduces the switching resistance of the current flow path.

A single diffusion stage was described above, meaning that the entire epi volume is processed in a single diffusion step. Alternatively, a first epi layer can be processed according to the described diffusion procedure, so that another epi layer is separated subsequently and the operation is repeated. Very thick volumes can be processed with such a multi-step diffusion method. Also, the starting material can be naturally provided with a desired doping profile in the vertical direction. Vertical variations can be used to improve the robustness of the structural component. Also, more than two doping elements can be used in a suitable manner to utilize their respective physical characteristics (for example during diffusion). Also, the intrinsic epi starting material can be replaced by a doped epi with a suitable construction. Also, the multilayered epi material described above can be placed on an intermediate layer which has a lower doping content instead of being placed directly on the highly doped substrate. The intermediate layer is n-doped e.g. for the conduction of electrons.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a voltage compensation structure, comprising:
    etching a trench into an epitaxial semiconductor material doped with n-type dopant atoms and p-type dopant atoms having diffusion constants differing by less than 50%;
    disposing a first semiconductor or insulating material along one or more sidewalls of the trench, the first semiconductor or insulating material having a dopant diffusion constant which is at least 2× different for the n-type dopant atoms than the p-type dopant atoms;
    disposing a second semiconductor material in the trench along the first semiconductor or insulating material, the second semiconductor material having a different dopant diffusion constant than the first semiconductor or insulating material; and
    diffusing more n-type dopant atoms or p-type dopant atoms from the epitaxial semiconductor material through the first semiconductor or insulating material into the second semiconductor material than the other type of dopant atoms so that a lateral charge separation occurs between the second semiconductor material and the epitaxial semiconductor material.

2. The method of claim 1, wherein the epitaxial semiconductor material is doped homogenously with the n-type dopant atoms and the p-type dopant atoms in a lateral direction extending parallel to a main surface of the epitaxial semiconductor material so that the epitaxial semiconductor material has a dopant variation of less than 3% in the lateral direction.

3. The method of claim 2, wherein the epitaxial semiconductor material is doped non-homogenously in a vertical direction extending perpendicular to the main surface of the epitaxial semiconductor material so that the dopant variation of the epitaxial semiconductor material in the vertical direction is greater than 1% and less than 50%.

4. The method of claim 1, wherein the epitaxial semiconductor material is formed by:
    blanket implanting the n-type dopant atoms and the p-type dopant atoms into a stack of epitaxial layers so that the stack of epitaxial layers has vertically offset regions of alternating conductivity types; and
    diffusing the blanket implanted dopant atoms in the stack of epitaxial layers to form the epitaxial semiconductor material which is doped homogenously in a lateral direction extending parallel to a main surface of the epitaxial semiconductor material so that the epitaxial semiconductor material has a dopant variation of less than 3% in the lateral direction.

5. The method of claim 4, wherein one or more of the epitaxial layers of the stack are doped more heavily than the other epitaxial layers.

6. The method of claim 4, wherein an implantation dose of the p-type and n-type dopant atoms differs by less than 3% in at least in some of the epitaxial layers.

7. The method of claim 1, wherein disposing the first semiconductor or insulating material along one or more sidewalls of the trench comprises epitaxially growing SiGe or SiGeC on one or more of the trench sidewalls.

8. The method of claim 7, wherein disposing the second semiconductor material in the trench comprising epitaxially growing undoped Si in the trench.

9. The method of claim 1, wherein the trench is etched so that the sidewalls are tapered.

10. The method of claim 1, wherein the epitaxial semiconductor material is disposed on a doped substrate and the trench etching is stopped prior to reaching the doped substrate.

11. The method of claim 1, further comprising removing the first semiconductor or insulating material from a bottom of the trench.

12. The method of claim 1, further comprising partially filling the trench with a dielectric material.

13. The method of claim 1, wherein the first semiconductor or insulating material comprises a multilayer of alternating SiGe and Si.

14. The method of claim 1, wherein the first semiconductor or insulating material is SiGe and the Ge content of the SiGe increases extending inward from the sidewalls, peaks, and then decreases.

15. The method of claim 1, wherein the n-type dopant atoms are phosphorous atoms and the p-type dopant atoms are boron atoms.

16. The method of claim 1, further comprising disposing an insulating osmosis layer in the trench between the one or more trench sidewalls and the doped second semiconductor material.

* * * * *